United States Patent [19]
Buschbom

[11] Patent Number: 5,982,186
[45] Date of Patent: Nov. 9, 1999

[54] CONTACTOR FOR TEST APPLICATIONS INCLUDING MEMBRANE CARRIER HAVING CONTACTS FOR AN INTEGRATED CIRCUIT AND PINS CONNECTING CONTACTS TO TEST BOARD

[75] Inventor: Milton L. Buschbom, Plano, Tex.

[73] Assignee: Texas Instruments Incorporated, Dallas, Tex.

[21] Appl. No.: 08/719,530

[22] Filed: Sep. 27, 1996

[51] Int. Cl.[6] .................................................. G01R 31/02
[52] U.S. Cl. .......................................... 324/755; 324/761
[58] Field of Search .................................... 324/754, 761, 324/762, 72.5, 755; 439/66, 68, 70, 67, 69, 525; 361/783, 784

[56] References Cited

U.S. PATENT DOCUMENTS

| | | | |
|---|---|---|---|
| 4,554,505 | 11/1985 | Zachry | 324/754 |
| 4,750,092 | 6/1988 | Werther | 361/783 |
| 5,123,850 | 6/1992 | Elder et al. | 439/67 |
| 5,481,436 | 1/1996 | Werther | 361/784 |

OTHER PUBLICATIONS

DiFrancesco, Larry, "Part Interconnect: A New Interrconnect Technology", *Apart From the Crowd, Proceedings of The Technical Program*, Surface Mount International Conference & Exposition, San Jose, California, Aug. 29–Sep. 2, 1993.

Portions from SEMATECH handout, BGA Infrastructure Workshop, Dallas, Texas, Oct. 12–14, 1994.

Nov.; 1992 Catalog of Semiconductor Accessories, Thermalloy, Inc.

*Primary Examiner*—Vinh P. Nguyen
*Attorney, Agent, or Firm*—Robert D. Marshall, Jr.; Gerald E. Laws; Richard L. Donaldson

[57] ABSTRACT

A method and apparatus are provided for integrated circuit testing applications. One aspect of the invention is a contactor (10) for test applications. The contactor (10) comprises a membrane carrier (12) having at least one contact (16) on the surface of the carrier (12) electrically connected to at least one terminal (18) on the carrier (12). A pin (14) is metallically bonded to the terminal (18).

18 Claims, 1 Drawing Sheet

# CONTACTOR FOR TEST APPLICATIONS INCLUDING MEMBRANE CARRIER HAVING CONTACTS FOR AN INTEGRATED CIRCUIT AND PINS CONNECTING CONTACTS TO TEST BOARD

TECHNICAL FIELD OF THE INVENTION

This invention relates generally to electrical contactors and more particularly to an improved contactor and method for use primarily in test applications.

BACKGROUND OF THE INVENTION

Membrane-type carriers are one type of device used to electrically connect surface-mounted integrated circuits to circuit testers after fabrication of the integrated circuit. A membrane-type carrier normally comprises a series of contacts, usually conductive pads, for making a temporary electrical connection with the surface-mounted integrated circuit. These contacts are electrically connected to terminals on the carrier. Carrier terminals ordinarily comprise a conductive pad or a plated-through hole in the membrane carrier. Circuit testers frequently use these terminals to electrically connect the carrier to additional circuitry on a tester board designed for testing a particular type of integrated circuit.

When the tester is operational the tester apparatus connects the integrated circuit being tested to the tester board by applying mechanical pressure to the part after placing it on top of the contacts of the membrane carrier. When testing is complete, the tester apparatus removes the integrated circuit and replaces it with another integrated circuit.

The membrane carrier flexes back and forth due to the placement of integrated circuits onto the carrier under mechanical pressure, followed by their removal. After a number of repetitions, this flexing can either cause one or more tears in the membrane carrier, or damage to the contacts or terminals. Because the tester board, to which the membrane carrier is attached, is normally an expensive board to manufacture, the user of the tester will normally replace the membrane carrier rather than discarding the tester board in favor of a new tester board. When a membrane carrier wears out, either the tester remains idle while a technician replaces the membrane carrier or a spare board must be used while a technician repairs the board with the damaged membrane carrier.

The terminals of a membrane carrier often are soldered to the test board using some type of metallic pin. When replacing a membrane carrier in such a board, one must unsolder the old carrier and solder a new carrier into the test board. This process can be expensive due to both the labor costs of technician time and the potentially large number of leads on a modern integrated circuit. Spare tester boards and tester down time also can be a significant expense.

SUMMARY OF THE INVENTION

Accordingly, a need has arisen for a contactor for use in a test board that does not have to be soldered to the test board. The contactor of the present invention may be inserted directly into a socket, plated-through holes, or another type of receptacle in a test board. It does not need to be soldered into the board. The contactor comprises a membrane carrier with at least one contact electrically connected to at least one terminal on the carrier. A pin is metallically bonded to the first terminal. The contactor may also have a plurality of contacts electrically connected to a plurality of terminals wherein a plurality of pins are metallically bonded to the plurality of terminals. The pins of the contactor can be inserted into a receptacle on the tester board.

The invention has several important technical advantages. Because the contactor can be attached to a tester board without a metallurgical connections it can be inserted and removed from the tester board in a matter of seconds. The invention dramatically reduces the amount of technician time required to install or remove the carrier from a tester board. Because contactors may be installed and removed without heating due to soldering, such that other circuitry on the tester board is not damaged by heat during installation or removal of the contactor, the invention will increase the overall life of the tester board. Tester down time should also be reduced and the user of the tester can maintain a lower inventory of spare tester boards for use when a contactor is damaged. Instead, because the disclosed contactor can be replaced quickly, a tester operator can likely replace the contactor as quickly as he could replace the tester board with a spare.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

Figure 1:
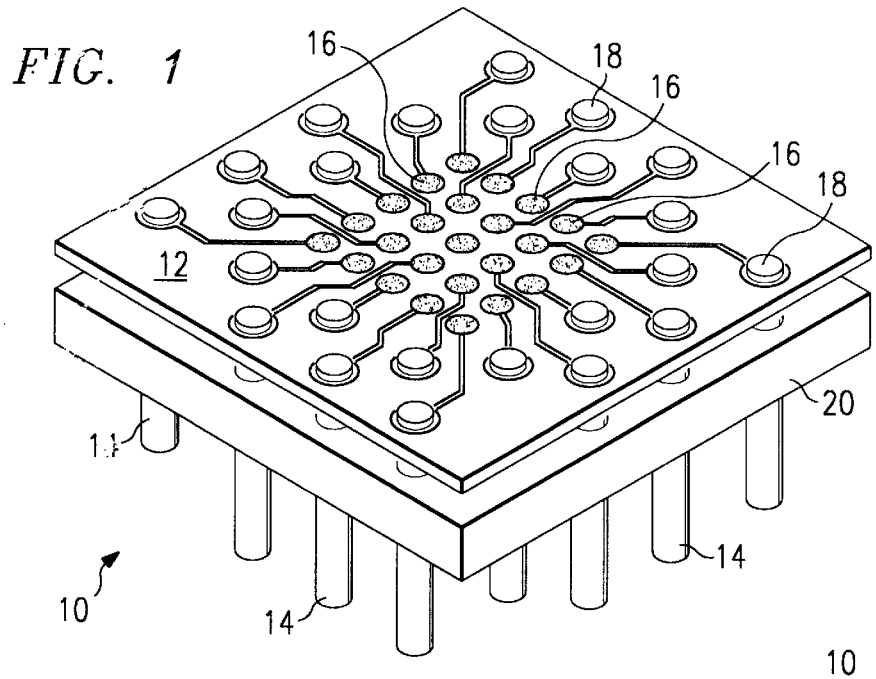
FIG. 1 illustrates a perspective view of a contactor constructed in accordance with the teachings of the present invention.
Figure 2:
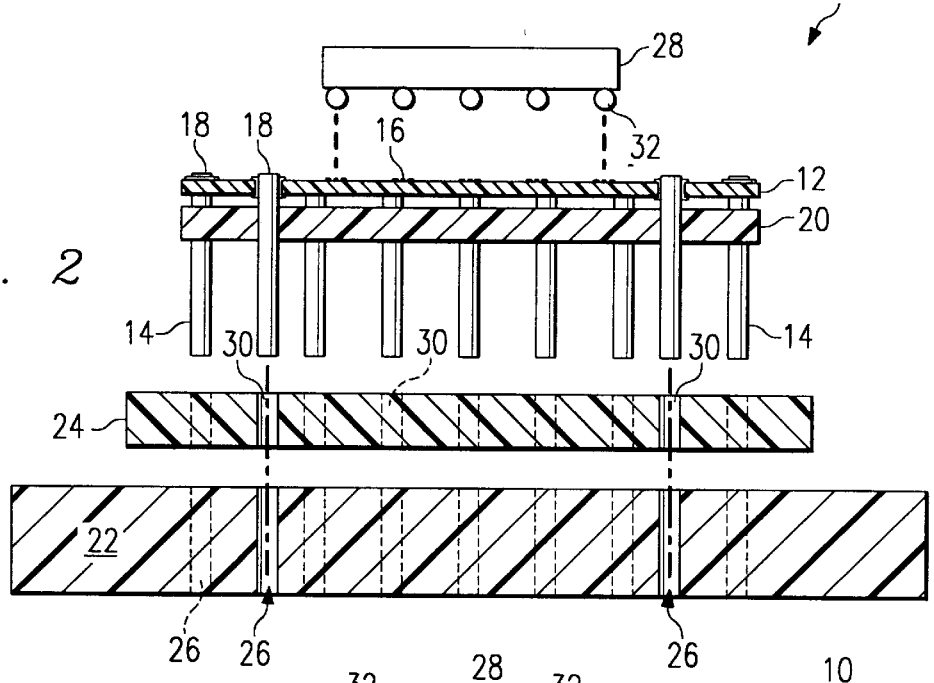
FIG. 2 illustrates a method for connecting an integrated circuit to a test board for testing using the contactor of FIG. 1.
Figure 3:
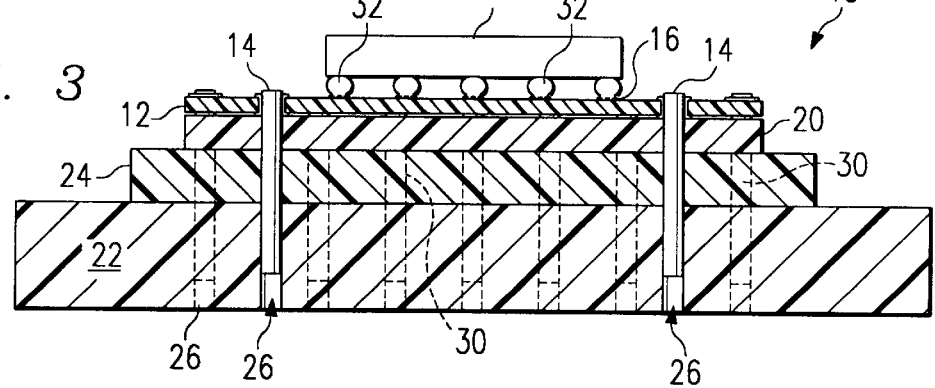
FIG. 3 illustrates the contactor of FIG. 1 in use with a test board.

The preferred embodiment of the present invention and its advantages are best understood by referring to FIGS. 1–3 of the drawings, like numerals being used for like and corresponding parts of the various drawings.

FIG. 1 illustrates an embodiment of a contactor 10 constructed in accordance with the teachings of the present invention. Contactor 10 comprises membrane carrier 12 and pins 14. Pins 14 are metallically bonded to membrane carrier 12.

Membrane carrier 12 comprises contacts 16 and terminals 18. Membrane carrier 12 is a thin film-type carrier with contacts 16 deposited on the surface and routed to terminals 18, which are through-pin terminals in this embodiment. A through-pin terminal may also be referred to as a plated-through hole.

Contacts 16 are formed using particle interconnect technology. They have a large number of asperities having very sharp and hard points because they are made of particles such as diamond particles, carbides, oxides, and/or other abrasive materials. This aspect of contacts 16 aids in forming a good electrical connection between carrier 12 and an integrated circuit brought into contact with contacts 16.

Each of the pins 14 is metallically bonded to one of the terminals 18. Each of the terminals 18a in turn, is electrically connected to one of the contacts 16. Contactor 10 may also include frame 20. Frame 20 is made out of plastic or any other non-conductive material and holds pins 14 at an essentially fixed distance from one another and helps to maintain their orientation essentially perpendicular to membrane carrier 12. Frame 20 may also provide strength to the overall structure of contactor 10 to enable it to be more easily inserted and/or removed from a circuit board or socket. The connection of frame 20 to contactor 10 is also illustrated in FIG. 2. Openings in frame 20 allow pins 14 to pass through and hold pins 14 securely in position FIG. 2 illustrates the operation of contactor 10 in connection with a test application. As discussed above, contactor 10 is particularly useful for connecting an integrated circuit to a test board for testing. Contactor 10 is inserted into test board 22 through plated-through holes 26 to form an electrical contact between contactor 10 and test board 22. Prior to insertion into test board 22, contactor 10 passes through holes 30 in pad 24. Pad 24 comprises a resilient material and lies between contactor 10 and test board 22. It provides backing force when an integrated circuit is pressed down on the contacts 16 of contactor 10. This backing force helps to create better electrical contact between the leads of an integrated circuit and contacts 16.

After contactor 10 has been inserted into pad 24 and test board 22, an integrated circuit may be tested using test board 22. Testing operations are performed after bringing integrated circuit 28 into contact with contacts 16 on contactor 10. In this example, integrated circuit 28 is a ball grid array. Each of the balls 32 contacts a contact 16 on contactor 10, thus providing an electrical connection between the ball 32 and contact 16.

FIG. 3 illustrates an integrated circuit 28 being tested on a test board 22 that has been assembled in accordance with the invention. As discussed in connection with FIG. 2, contactor 10 has been inserted into pad 24 and test board 22. The balls 32 on integrated circuit 28 mechanically contact the contacts 16 on contactor 10.

It should be understood that the invention is not limited to the illustrated structures and that a number of substitutions can be made without departing from the scope and teachings of the present invention. For example, membrane carrier 12 is a thin film-type carrier. Other types of membrane carriers could be used. In addition, membrane carrier 12 employs contacts 16 with a high number of surface asperities. Contacts 16 could also be other types of contacts such as embedded fine wires, spring wire contacts, fuzz buttons, etc. Similarly, terminals 18 are plated-through holes. Alternatively, terminals 18 could be conductive pads on either the top or bottom surface of membrane carrier 12, or any other type of terminal.

In this embodiment, each contact 16 connects to one terminal 18. Alternatively, multiple contacts 16 could be connected to a single terminal 18. Similarly, multiple terminals 18 could be connected to a single contact 16.

The pins 14 and frame 20 could also vary from the embodiment shown. In this examples a pin 14 connects to each of the terminals 18. However, a pin 14 does not necessarily have to be connected to each of the terminals 18. Frame 20 is a plastic frame, but could be any non-conductive material.

Moreover, contactor 10 could be connected to test board 22 in numerous ways. In the example illustrated in FIG. 2, contactor 10 is inserted into plated-through holes 26 in test board 22. Any technology used to connect a contactor 10 having pins 14 to a test board 22 could be used such as a socket connected to test board 22. Resilient pad 24 can be made out of any resilient, non-conductive material.

The invention can be used with numerous surface mounted technologies. The example membrane carrier 12 shown in FIG. 1 is for use with a ball grid array (BGA). Similarly, integrated circuit 28, shown in FIGS. 2 and 3 as an example to illustrate the function invention, is a ball grid array. Other carriers can be used, however. An appropriate membrane carrier 12 can be selected depending upon the surface mount technology of the integrated circuit 28 to be tested on test board 22. Other examples of surface mount technologies with which the present invention can be used include solder grid arrays (SGAs), solder column arrays (SCAs), land grid arrays (LGAs), quad flat packs (QFPs), flat packs (FPs), plastic leaded chip carriers (PLCCs), small outline integrated circuits (SOICs), small outline packages (SOPs), shrink small outline packages (SSOPs), pin grid arrays (PGAs), component blocks such as SIM modules, 3-D stacks, and/or any other surface mount technology.

Although the present invention has been described in detail, it should be understood that various changes, substitutions and alterations can be made hereto without departing from the spirit and scope of the invention as defined by the appended claims.

What is claimed is:

1. A test board, comprising:
   a printed circuit board including a first plated through hole; and
   a contactor comprising a membrane carrier and a first pin, the membrane carrier comprising a first contact on a first surface of the carrier, the first contact electrically connected to a first terminal on the carrier consisting of a plated through pin terminal, wherein the first pin passes through and is metallically bonded to the first terminal at the plated through pin terminal, and wherein the first pin is electrically connected to the printed circuit board by insertion into the first plated through hole.

2. The test board of claim 1, wherein the first contact further comprises a fuzz button adapted for electrical contact with a second contact of an integrated circuit.

3. The test board of claim 1, further comprising a resilient pad between the membrane carrier and the printed circuit board.

4. The test board of claim 1, wherein the contactor further comprises a first plurality of contacts on the first surface, ones of the first plurality of contacts electrically connected to ones of a first plurality of terminals on the carrier, and a first plurality of pins, ones of the first plurality of pins metallically bonded to ones of the first plurality of terminals; and wherein the test board further comprises a frame coupled to the first plurality of pins and operable to hold ones of the first plurality of pins at an essentially fixed distance from one another.

5. The test board of claim 1 wherein:
   the first contact includes
      a first pad adapted for electrical contact with a second contact of an integrated circuit, and
      particulate material disposed on the first pad having a large number of asperites having a large number of very sharp and hard points.

6. The test board of claim 5, wherein the particulate material of the first contact comprises a plurality of diamond particles.

7. The method of claim 5 wherein:
   the particular material comprises carbides.

8. The method of claim 5 wherein:
   the particular material comprises oxides.

9. The method of claim 5 wherein:
   the particular material comprises abrasive material.

10. A test board, comprising:

a printed circuit board including a first socket hole electrically connected to the printed circuit board; and a contractor comprising a membrane carrier and a first pin, the membrane carrier comprising a first contact on a first surface of the carrier, the first contact electrically connected to a first terminal on the carrier consisting of a plated through pin terminal, wherein the first pin passes through and is metallically bonded to the first terminal at the plated through pin terminal, and wherein the first pin is electrically connected to the printed circuit board by insertion into the first socket hole.

11. The test board of claim 10, wherein the first contact further comprises a fuzz button adapted for electrical contact with a second contact of an integrated circuit.

12. The test board of claim 10, further comprising a resilient pad between the membrane carrier and the printed circuit board.

13. The test board of claim 10, wherein:

the contactor further comprises a first plurality of contacts on the first surface, ones of the first plurality of contacts electrically connected to ones of a first plurality of terminals on the carrier, and a first plurality of pins, ones of the first plurality of pins metallically bonded to ones of the first plurality of terminals; and wherein the test board further comprises a frame coupled to the first plurality of pins and operable to hold ones of the first plurality of pins at an essentially fixed distance from one another.

14. The test board of claim 10, wherein:

the first contact includes a first pad adapted for electrical contact with a second contact of an integrated circuit, and particulate material disposed on the first pad having a large number of asperites having a large number of very sharp and hard points.

15. The test board of claim 14, wherein the particulate material of the first contact comprises a plurality of diamond particles.

16. The method of claim 14, wherein:

the particular material comprises carbides.

17. The method of claim 14, wherein:

the particular material comprises oxides.

18. The method of claim 14, wherein:

the particular material comprises abrasive material.

* * * * *

UNITED STATES PATENT AND TRADEMARK OFFICE
CERTIFICATE OF CORRECTION

PATENT NO. : 5,982,186
DATED : November 9, 1999
INVENTOR(S) : Milton L. Buschbom It is certified that error appears in the above-identified patent and that said Letters Patent is hereby corrected as shown below:

Title Page:
Insert Item [60] under Related U.S. Application Data --Provisional Application No. 60/004,426 September 28, 1995.--

Signed and Sealed this

Nineteenth Day of June, 2001

Attest:

NICHOLAS P. GODICI
Attesting Officer    Acting Director of the United States Patent and Trademark Office